United States Patent
Jeon et al.

(10) Patent No.: US 10,965,275 B2
(45) Date of Patent: Mar. 30, 2021

(54) DEVICE FOR MAINTAINING OPERATION STATE OF RELAY

(71) Applicant: Samsung SDI Co., Ltd., Yongin-si (KR)

(72) Inventors: Peelsik Jeon, Yongin-si (KR); Huntae Ro, Yongin-si (KR); Sukki Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 16/837,647

(22) Filed: Apr. 1, 2020

(65) Prior Publication Data
US 2020/0321945 A1    Oct. 8, 2020

(30) Foreign Application Priority Data
Apr. 2, 2019  (KR) .................. 10-2019-0038601

(51) Int. Cl.
*H03K 3/012*   (2006.01)
*H03K 5/24*    (2006.01)

(52) U.S. Cl.
CPC ............... *H03K 3/012* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 6,060,834 A | 5/2000 | Vilkinofsky et al. | |
| 6,674,628 B1 * | 1/2004 | Wohlfarth | H01H 47/325 361/152 |
| 8,680,717 B2 * | 3/2014 | Morimoto | H01H 47/325 307/116 |

(Continued)

FOREIGN PATENT DOCUMENTS

| KR | 1996-0008888 A | 3/1996 |
|---|---|---|
| KR | 10-2006-0070775 A | 6/2006 |
| KR | 10-2016-0140293 A | 12/2016 |

OTHER PUBLICATIONS

Kishore, G.V., et al., "Circuit Options Explore Issues, Solutions for Relay Drivers," Electronic Design, Penton Media, Oct. 2013, pp. 1-8.

(Continued)

*Primary Examiner* — Jeffery S Zweizig
(74) *Attorney, Agent, or Firm* — Lewis Roca Rothgerber Christie LLP

(57) ABSTRACT

A device for maintaining an operation state of a relay with a second voltage value that is less than a first voltage value, the first voltage value being an initial driving voltage for the relay, includes: a main switch to output an output voltage to the relay by switching an input voltage according to a main operating voltage that varies according to an ON-OFF state of a first switch; the first switch to adjust the main operating voltage according to a first operating voltage that varies according to an ON-OFF state of a second switch; the second switch to control the first operating voltage according to an output voltage of a comparator; the comparator to output the output voltage by comparing a reference voltage value with a voltage of a reference node; and a third switch to control the voltage of the reference node according to an input signal.

11 Claims, 8 Drawing Sheets

(56) References Cited

U.S. PATENT DOCUMENTS 9,666,396 B2 * 5/2017 Morimoto ............ H03K 17/165
10,170,257 B2 * 1/2019 Chennakesavan ..... H01H 47/04

OTHER PUBLICATIONS

EPO Extended European Search Report dated Sep. 9, 2020, issued in corresponding European Patent Application No. 20167843.0 (9 pages).

* cited by examiner

DEVICE FOR MAINTAINING OPERATION STATE OF RELAY

CROSS-REFERENCE TO RELATED APPLICATION

This application claims priority to and the benefit of Korean Patent Application No. 10-2019-0038601, filed on Apr. 2, 2019, in the Korean Intellectual Property Office, the entire disclosure of which is incorporated by reference herein.

BACKGROUND

1. Field

Aspects of one or more example embodiments of the present disclosure relate to a device for maintaining the operation state of a relay, and more particularly to a device for maintaining the operation state of a relay with a second voltage value that is less than a first voltage value, which is an initial driving voltage for the relay.

2. Description of Related Art

With the development of electric vehicles, energy storage device technology, and/or the like, various techniques relating to battery packs have been advanced. Further, a trend of designing battery packs having a higher operating voltage and a larger capacity for driving such devices has emerged.

Such battery packs are generally connected to electronic devices through relays for driving the electronic devices.

However, even after the transition of a relay from an OFF state to an ON state, a voltage applied for the transition of the relay may be continuously applied to the relay. Thus, such battery packs may consume more electricity than necessary or desired, and the relay may remain in a high-temperature state, which may cause a decrease in the lifespan of the relay.

The above information disclosed in this Background section is for enhancement of understanding of the background of the present disclosure, and therefore, it may contain information that does not constitute prior art.

SUMMARY

One or more example embodiments of the present disclosure are directed to a device configured to maintain a relay operation state by applying a voltage to the relay, after the transition of the relay from an OFF state to an ON state, that is less than a voltage used for the state transition of the relay.

One or more example embodiments of the present disclosure are directed to a device configured to maintain a relay operation state by using a relatively low voltage for maintaining the state of the relay, thereby increasing the lifespan of the relay and/or preventing or reducing accidents caused by malfunctions of the relay.

Additional aspects and features of the present disclosure will be set forth in part in the description which follows, and in part, will be apparent from the description, or may be learned by practicing one or more example embodiments of the present disclosure.

According to one or more example embodiments of the present disclosure, a device for maintaining an operation state of a relay with a second voltage value that is less than a first voltage value, the first voltage value being an initial driving voltage for the relay, includes: a main switch configured to output an output voltage to the relay by switching an input voltage according to a main operating voltage that varies according to an ON-OFF state of a first switch; the first switch configured to adjust the main operating voltage according to a first operating voltage that varies according to an ON-OFF state of a second switch; the second switch configured to control the first operating voltage according to an output voltage of a comparator; the comparator configured to output the output voltage by comparing a reference voltage value with a voltage of a reference node; and a third switch configured to control the voltage of the reference node according to an input signal.

In an example embodiment, the voltage of the reference node may have a third voltage value, when the third switch is turned off before the input signal is input; the main switch may be configured to be turned on as the input voltage having a fourth voltage value is applied; and the output voltage of the main switch may become equal to the fourth voltage value according to the turned-on main switch.

In an example embodiment, the voltage of the reference node may become equal to a fifth voltage value that may be greater than the third voltage value in response to the output voltage of the main switch having the fourth voltage value; the comparator may be configured to turn on the second switch according to a comparison result of a comparison between the voltage of the reference node having the fifth voltage value and the reference voltage value; the turned-on second switch may be configured to turn on the first switch by increasing the first operating voltage; and the turned-on first switch may be configured to turn off the main switch by increasing the main operating voltage.

In an example embodiment, the output voltage of the main switch may decrease over time from the fourth voltage value by the turned-off main switch, and the voltage of the reference node may decrease over time from the fifth voltage value in response to the output voltage of the main switch decreasing over time.

In an example embodiment, when the voltage of the reference node decreases over time to become equal to a sixth voltage value that may be less than the reference voltage: the comparator may be configured to turn off the second switch according to a comparison result of a comparison between the reference voltage value and the voltage of the reference node having the sixth voltage value; the turned-off second switch may be configured to turn off the first switch by decreasing the first operating voltage; and the turned-off first switch may be configured to turn on the main switch by decreasing the main operating voltage.

In an example embodiment, the output voltage of the main switch may become equal to the fourth voltage value by the turned-on main switch.

In an example embodiment, the device may be configured to generate the output voltage of the main switch to have an average value that corresponds to the first voltage value according to the switching of the main switch.

In an example embodiment, the output voltage of the main switch may have the fourth voltage value, and the third switch may be turned on, when the input voltage having the fourth voltage value is applied; the voltage of the reference node may become equal to a seventh voltage value greater than the fifth voltage value; the comparator may be configured to turn on the second switch according to a comparison result of a comparison between the reference voltage value and the voltage of the reference node having the seventh voltage value; the turned-on second switch may be configured to turn on the first switch by increasing the first operating voltage; and the turned-on first switch may be configured to turn off the main switch by increasing the main operating voltage.

In an example embodiment, the output voltage of the main switch may decrease over time from the fourth voltage value by the turned-off main switch; and the voltage of the reference node may decrease over time from the seventh voltage value in response to the output voltage of the main switch decreasing over time.

In an example embodiment, a time period that it takes for the voltage of the reference node to become less than the reference voltage from the fifth voltage value may be shorter than a time period that it takes for the voltage of the reference node to become less than the reference voltage from the seventh voltage value.

In an example embodiment, the device may be configured to generate the output voltage of the main switch to have an average value that corresponds to the second voltage value according to the switching of the main switch.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
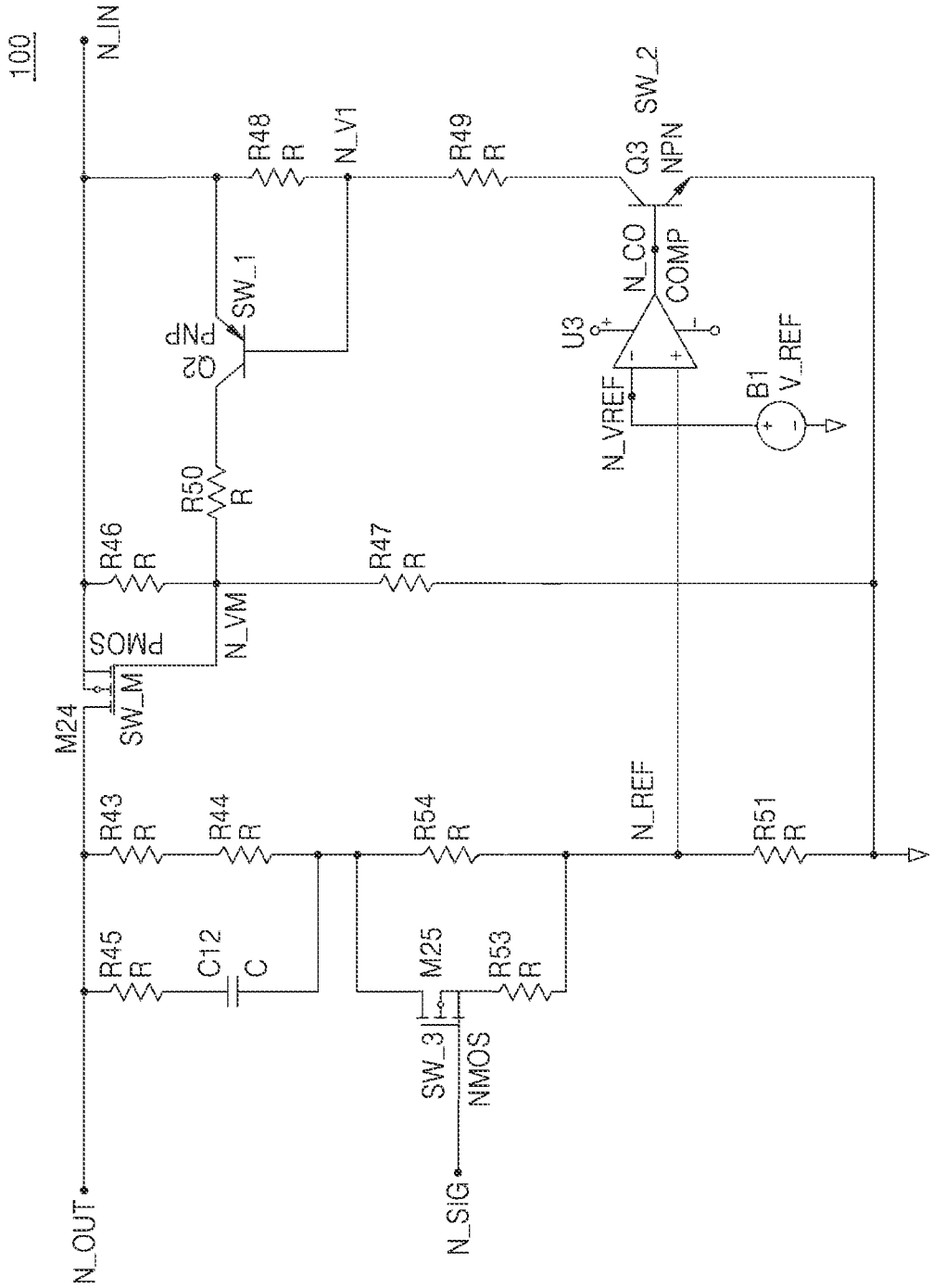
FIG. 1 is a schematic circuit diagram illustrating an example configuration of a relay operation state maintaining device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when a particular embodiment may be implemented differently, a specific process order may be different from a described one. For example, two processes that are consecutively described may be performed at the same or substantially at the same time, or may be performed in an order opposite to the described order. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, the specific examples of shapes, structures, features, and/or the like described in one example embodiment may be modified in another embodiment without departing from the spirit and scope of the present disclosure. In addition, the positions and/or arrangements of components and elements described in one example embodiment may be variously modified in another example embodiment within the spirit and scope of the present disclosure. In other words, the details described with reference to one or more example embodiments of the present disclosure are provided as examples, and as such, the details may be variously modified in other example embodiments within the spirit and scope of the present disclosure.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, or component is referred to as being "on," "connected to," or "coupled to" another element, layer, or component, it can be directly on, connected to, or coupled to the other element, layer, or component, or one or more intervening elements, layers, or components may be present. In addition, it will also be understood that when an element, layer, or component is referred to as being "between" two elements, layers, or components, it can be the only element, layer, or component between the two elements, layers, or components, or one or more intervening elements, layers, or components may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, "A and/or B" refers to A or B, or A and B. Expressions such as "at least one of," when preceding a list of elements, modify the entire list of elements and do not modify the individual elements of the list. For example, the expression "at least one of a, b, and c" may indicate only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic circuit diagram illustrating an example configuration of a relay operation state maintaining device 100 according to an embodiment.

In an embodiment, the relay operation state maintaining device 100 may maintain or substantially maintain the operation state of a relay by using a second voltage value that is lower than a first voltage value used as an initial driving voltage for the relay. In an embodiment, for example, the relay operation state maintaining device 100 may initially turn on the relay with a voltage having a value of 12 V, and may then maintain or substantially maintain the turned-on state of the relay by maintaining or substantially maintaining a voltage having a value of 2 V.

For example, in an embodiment, the relay operation state maintaining device 100 may include a main switch SW_M, a first switch SW_1, a second switch SW_2, a third switch SW_3, and a comparator COMP.

In an embodiment, the main switch SW_M may output an output voltage to the relay. The output voltage may be generated by switching an input voltage according to (e.g., based on) a main operating voltage, which may vary according to the ON-OFF state of the first switch SW_1. In this case, the main operating voltage may refer to the voltage of an input node N_VM of the main switch SW_M, the input voltage may refer to the voltage of a node (e.g., an input terminal) N_IN to which power is connected, and the output voltage may refer to the voltage of a node (e.g., an output terminal) N_OUT to which the relay is connected. The first switch SW_1 will be described in more detail below.

As used in the present disclosure, the term "switching" may refer to a continuous on-off switching of a power at least during a suitable or desired period of time (e.g., a predetermined or a certain period of time). For example, in an embodiment, the main switch SW_M may be repeatedly switched on and off to repeatedly make and break (e.g., to repeatedly connect and disconnect) an electrical connection between the node N_IN, to which power is connected, and the node N_OUT, to which the relay is connected.

Because of the electrical connection between the node N_IN, to which power is connected, and the node N_OUT, to which the relay is connected, the two nodes N_IN and N_OUT may temporarily have the same or substantially the same voltage. Because of the electrical disconnection between the node N_IN, to which power is connected, and the node N_OUT, to which the relay is connected, the voltage of the node N_OUT, to which the relay is connected, may temporarily decrease.

In addition, the average voltage of the node N_OUT, to which the relay is connected, may be controlled by adjusting the duration of the electrical connection between the node N_IN, to which power is connected, and the node N_OUT, to which the relay is connected, and/or by adjusting the duration of the electrical disconnection between the node N_OUT, to which the relay is connected, and the node N_IN, to which power is connected.

For example, the average voltage of the node N_OUT, to which the relay is connected, may be decreased by increasing the duration of the electrical disconnection between the node N_IN, to which power is connected, and the node N_OUT, to which the relay is connected.

On the other hand, the average voltage of the node N_OUT, to which the relay is connected, may be increased by increasing the duration of electrical connection between the node N_IN, to which power is connected, and the node N_OUT, to which the relay is connected.

Therefore, in an embodiment, the voltage, which may be applied to maintain or substantially maintain the operation state of the relay connected to the node N_OUT, may be adjusted by adjusting the above-described durations.

In an embodiment, the main switch SW_M may be implemented as any suitable switch, for example, such as one of a field effect transistor (FET), a bipolar junction transistor (BJT), an insulated gate bipolar mode transistor (IGBT), and a relay. However, the present disclosure is not limited thereto.

The main switch SW_M may be turned on when a voltage that is greater than or equal to a threshold voltage is supplied thereto, and may be turned off when a voltage that is less than the threshold voltage is supplied thereto. In addition, the main switch SW_M may enter into a short state when turned on, and may enter into an open state when turned off.

In an embodiment, the first switch SW_1 may adjust the main operating voltage according to (e.g., based on) a first operating voltage, which may vary according to the ON-OFF state of the second switch SW_2. In this case, the first operating voltage may refer to the voltage of an input node N_V1 of the first switch SW_1, and the main operating voltage may refer to the voltage of the input node N_VM of the main switch SW_M as described above. The second switch SW_2 will be described in more detail below.

In an embodiment, the first switch SW_1 may be implemented as any suitable switch, for example, such as one of a FET, a BJT, an IGBT, and a relay. However, the present disclosure is not limited thereto.

The first switch SW_1 may be turned on when a voltage that is greater than or equal to a threshold voltage is supplied thereto, and may be turned off when a voltage that is less than the threshold voltage is supplied thereto. In addition, the first switch SW_1 may enter into a short state when turned on, and may enter into an open state when turned off.

In an embodiment, the second switch SW_2 may control the first operating voltage according to (e.g., based on) the output voltage of the comparator COMP. In this case, the output voltage of the comparator COMP may refer to the voltage of an output node N_CO of the comparator COMP, and the first operating voltage may refer to the voltage of the input node N_V1 of the first switch SW_1 as described above. The comparator COMP will be described in more detail below.

In an embodiment, the second switch SW_2 may be implemented as any suitable switch, for example, such as one of an FET, a BJT, an IGBT, and a relay. However, the present disclosure is not limited thereto.

The second switch SW_2 may be turned on when a voltage that is greater than or equal to a threshold voltage is supplied thereto, and may be turned off when a voltage that is less than the threshold voltage is supplied thereto. In addition, the second switch SW_2 may enter into a short state when turned on, and may enter into an open state when turned off.

In an embodiment, the comparator COMP may compare a reference voltage value V_REF with the voltage of a reference node N_REF, and may output comparison results of the comparison to the output node N_CO. In this case, the reference voltage value V_REF may refer to a suitable or desired voltage value (e.g., a predetermined constant or substantially constant voltage value), for example, such as 5 V.

For example, when the voltage of the reference node N_REF is greater than the reference voltage value V_REF, the comparator COMP may output a digital "True" (e.g., a high-level such as 5 V). On the other hand, when the voltage of the reference node N_REF is less than the reference voltage value V_REF, the comparator COMP may output a digital "False" (e.g., a low-level such as 0 V).

As used in the present disclosure, the phrase "voltage of XX" may be used as a conceptual variable that varies with time, and the phrase "YY voltage value" may be used as a conceptual constant that does not vary with time. For example, the phrase "voltage of the reference node N_REF" may refer to the voltage of the reference node N_REF that varies with time (e.g., voltage values of the reference node N_REF with respect to time). Further, for example, the phrase "reference voltage value V_REF" may refer to a fixed voltage value that does not vary with time.

In the present disclosure, the phrase "voltage of XX" may be mainly expressed in the form of the "voltage of a node N_XX," and the phrase "YY voltage value" may be mainly expressed with a symbol, for example, such as "V_YY."

In an embodiment, the third switch SW_3 may control the voltage of the reference node N_REF according to (e.g., based on) an input signal. In this case, the input signal may refer to a signal applied to an input node N_SIG.

In an embodiment, the third switch SW_3 may be implemented as any suitable switch, for example, such as one of a FET, a BJT, an IGBT, and a relay. However, the present disclosure is not limited thereto.

The third switch SW_3 may be turned on when a voltage that is greater than or equal to a threshold voltage is supplied thereto, and may be turned off when a voltage that is less than the threshold voltage is supplied thereto. In addition, the third switch SW_3 may enter into a short state when turned on, and may enter into an open state when turned off.

For example, when a digital 'True' (e.g., 5 V) input signal is input to the third switch SW_3, the third switch SW_3 may increase the voltage of the reference node N_REF according to a parallel resistor R53 at (e.g., in or on) a path connecting the reference node N_REF to the node N_OUT to which the relay is connected.

Figure 2A:
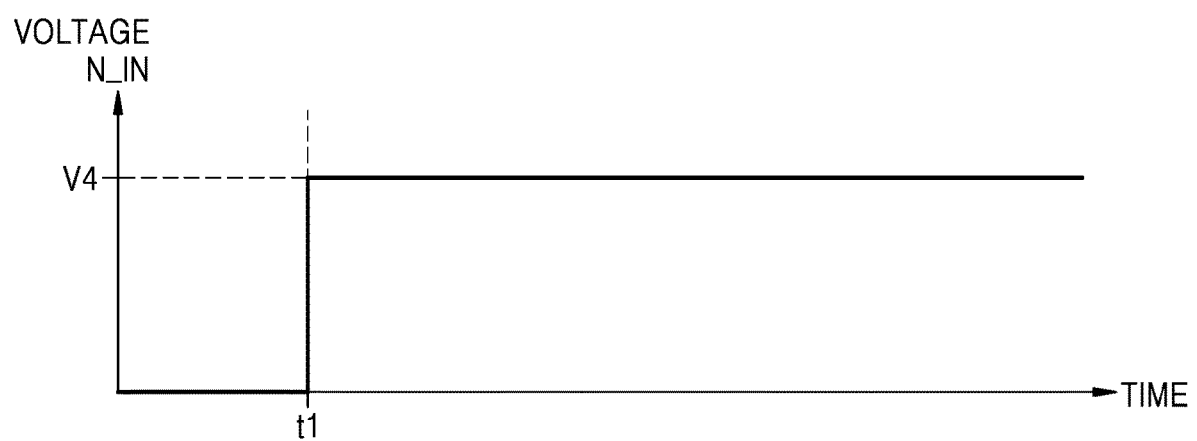
FIGS. 2A-2F are signaling diagrams illustrating a method of operating the relay operation state maintaining device over time according to an embodiment.
Figure 2B:
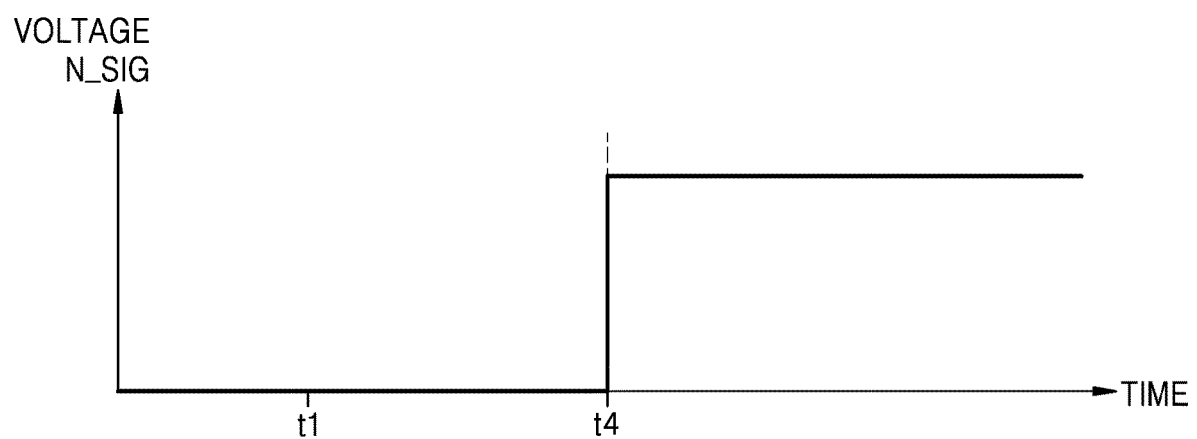

Hereinafter, a method of operating the relay operation state maintaining device 100 will be described with reference to FIGS. 2A to 2F. For convenience, the following description with reference to FIGS. 2A to 2F assumes that a power source having a fourth voltage value V4 is connected to the node N_IN at a time point t1 as shown in FIG. 2A, an input signal is applied to the input node N_SIG at a time point t4 as shown in FIG. 2B, and the voltage of the reference node N_REF has a third voltage value V3 before the time point t1.

An operation of the relay operation state maintaining device 100 during time point t1 to time point t4 will be described in more detail hereinafter.

Figure 2C:
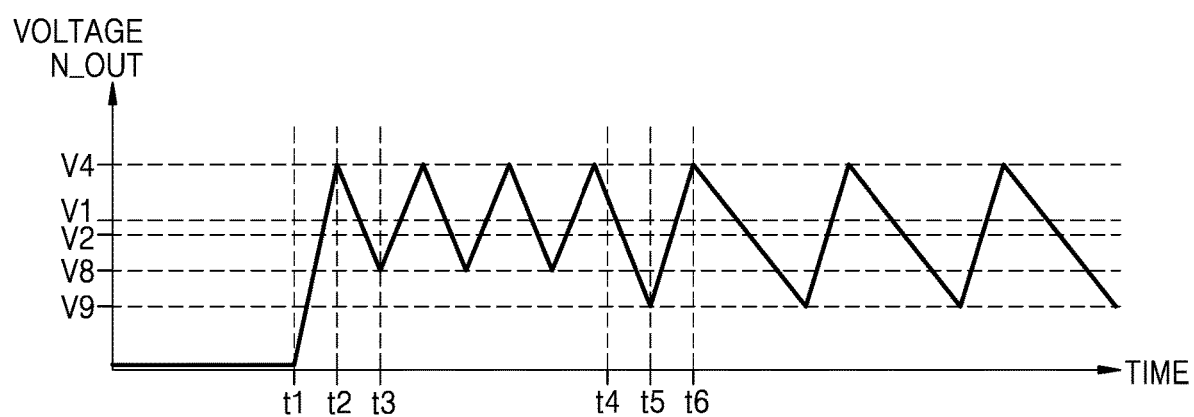
Figure 2D:
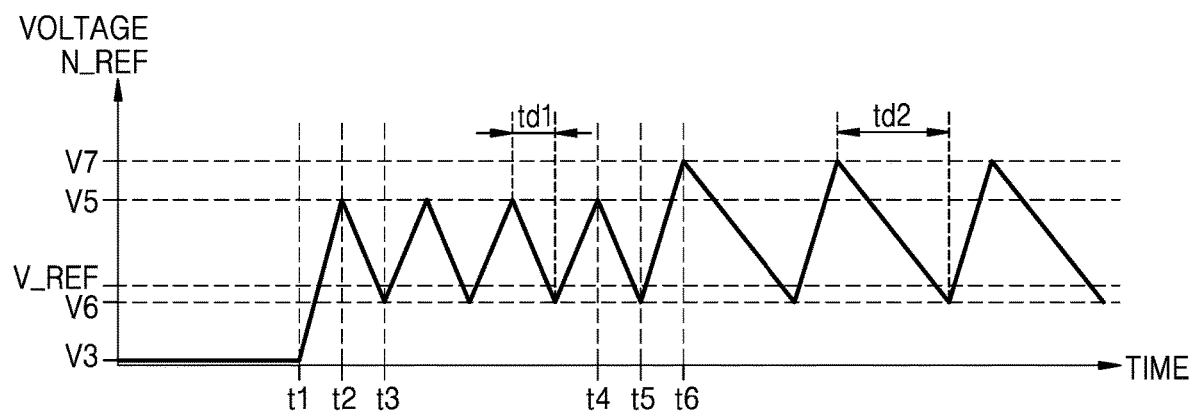
Figure 2E:
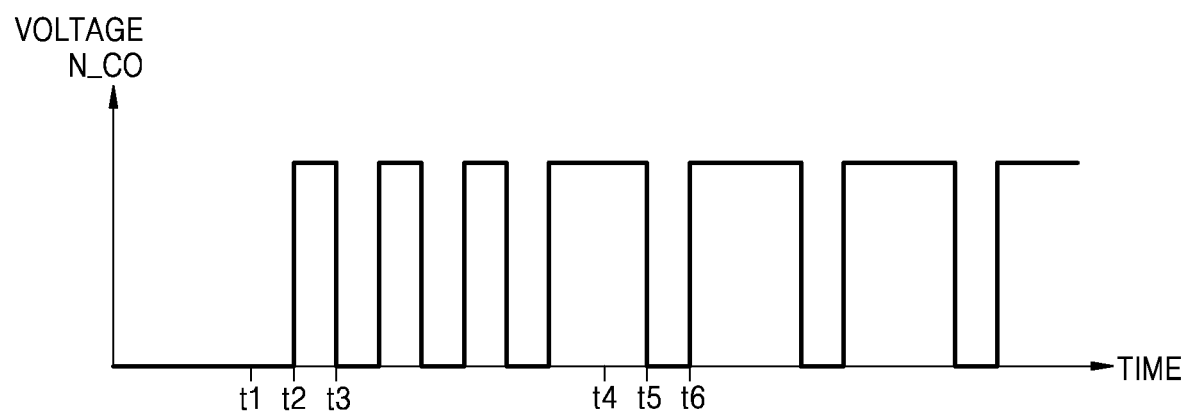
Figure 2F:
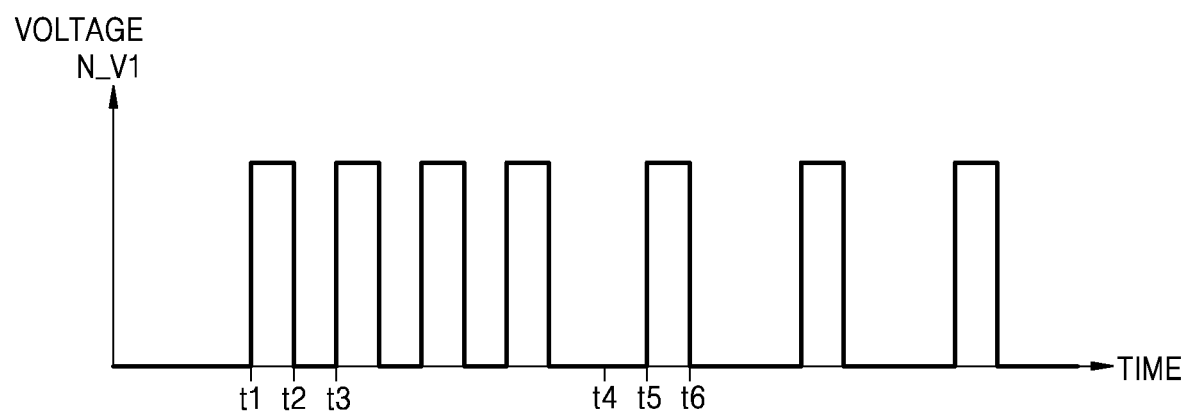

Referring to FIGS. 1 to 2F, as disclosed above, power is supplied starting from the time point t1, and the input signal is applied at the time point t4. Therefore, the third switch SW_3 may be in an OFF state during a time period from the time point t1 to the time point t4.

According to an embodiment, as the power having the fourth voltage value V4 is supplied at the time point t1, the main switch SW_M may be turned on. Because the main switch SW_M is turned on, the voltage of the node N_OUT, to which the relay is connected, may increase over time, and thus, the voltage of the node N_OUT may be equal to or substantially equal to the fourth voltage value V4 at a time point t2 (e.g., as shown in FIG. 2C). In other words, as the main switch SW_M is turned on, the voltages of the nodes N_IN and N_OUT may become equal to or substantially equal to the fourth voltage value V4.

At the time point t2, because the voltage of the node N_OUT is equal to or substantially equal to the fourth voltage value V4, the voltage of the reference node N_REF may become equal to or substantially equal to a fifth voltage value V5, which may be greater than the third voltage value V3. At this time, the comparator COMP may turn on the second switch SW_2 according to (e.g., based on) the comparison result of the comparison between the voltage of the reference node N_REF, which has the fifth voltage value V5, and the reference voltage value V_REF (e.g., as shown in FIG. 2D, the fifth voltage value V5 is greater than the reference voltage value V_REF).

The second switch SW_2, which is turned on by the comparator COMP, decreases the first operating voltage (e.g., the voltage of the input node N_V1), thereby turning on the first switch SW_1. In addition, when the first switch SW_1 is turned on, the first switch SW_1 may increase the main operating voltage (e.g., the voltage of the input node N_VM), and thus, may turn off the main switch SW_M.

As the main switch SW_M is turned off, the output voltage (e.g., the voltage of the node N_OUT) may decrease with time from the fourth voltage value V4 to an eighth voltage value V8 (e.g., as shown in FIG. 2C), and thus, the voltage of the reference node N_REF may also decrease with time from the fifth voltage value V5.

When the voltage of the reference node N_REF, which decreases with time, becomes equal to or substantially equal to a sixth voltage value V6 that is less than the reference voltage value V_REF at a time point t3 (e.g., as shown in FIG. 2D), the comparator COMP may turn off the second switch SW_2 according to (e.g., based on) a comparison result of the comparison between the voltage of the reference node N_REF, which has the sixth voltage value V6, and the reference voltage value V_REF.

The second switch SW_2, which is turned off, may turn off the first switch SW_1 by increasing the first operating voltage (e.g., the voltage of the input node N_V1), and the first switch SW_1, which is turned off, may turn on the main switch SW_M by decreasing the main operating voltage (e.g., the voltage of the input node N_VM).

As the main switch SW_M is turned on, the value of the output voltage (e.g., the voltage of the node N_OUT) may again become equal to or substantially equal to the fourth voltage value V4.

As disclosed above, in an embodiment, the relay operation state maintaining device 100 may repeat the switching operation between decreasing the value of the output voltage (e.g., the voltage of the node N_OUT) from the fourth voltage value V4 to the eighth voltage V8 value, and increasing the value of the output voltage from the eighth voltage value V8 to the fourth voltage value V4. Accordingly, the relay operation state maintaining device 100 may generate an output voltage having an average value corresponding to the first voltage value.

In other words, during the time period from the time point t1 to the time point t4 before an input signal is applied to the input node N_SIG, the relay operation state maintaining device 100 may generate an output voltage having the average value corresponding to (e.g., that is equal to or substantially equal to) the first voltage value.

An operation of the relay operation state maintaining device 100 after time point t4 will be described in more detail hereinafter.

An input signal may be applied to the third switch SW_3 at the time point t4 (e.g., see FIG. 2B). Therefore, at (e.g., after) the time point t4, the third switch SW_3 may be in an ON state. The input signal applied to the input node N_SIG of the third switch SW_3 may be a signal that is generated and output by a controller. For example, the controller may apply the input signal after a suitable or desired period of time (e.g., a predetermined period of time) has passed from the time point at which an initial driving voltage, for example, the first voltage value, is applied to the relay connected to the relay operation state maintaining device 100.

When the third switch SW_3 is turned on, the resistor R53 is added (e.g., is connected) in parallel to a resistor R54 that determines the voltage of the reference node N_REF, and thus, the resistance of the path connecting the node N_OUT and the reference node N_REF to each other decreases, thereby increasing the voltage of the reference node N_REF.

The increase in the voltage of the reference node N_REF may cause a change in an upper limit voltage of the reference node N_REF.

In other words, due to the input of the input signal, the upper limit of the voltage of the reference node N_REF may become a seventh voltage value V7 that is greater than the fifth voltage value V5 (e.g., see FIG. 2D). When the voltage of the node N_OUT has the fourth voltage value V4 (e.g., at the time point t6), the voltage of the reference node N_REF may reach the seventh voltage value V7 (e.g., at the time point t6).

At the time point t6, the voltage of the reference node N_REF may have the seventh voltage value V7 as disclosed above. At this time, the comparator COMP may turn on the second switch SW_2 according to (e.g., based on) a comparison result of the comparison between the voltage of the reference node N_REF, which has the seventh voltage value V7, and the reference voltage value V_REF (e.g., as shown in FIG. 2D, the seventh voltage value V7 is greater than the reference voltage value V_REF).

The second switch SW_2, which is turned on by the comparator COMP, decreases the first operating voltage (e.g., the voltage of the input node N_V1), thereby turning on the first switch SW_1. In addition, the first switch SW_1, which is turned on, may increase the main operating voltage (e.g., the voltage of the input node N_VM), and thus, may turn off the main switch SW_M.

As the main switch SW_M is turned off, the output voltage (e.g., the voltage of the node N_OUT) may decrease over time from the fourth voltage value V4 to a ninth voltage value V9 (e.g., as shown in FIG. 2C), and thus, the voltage of the reference node N_REF may also decrease over time from the seventh voltage value V7 (e.g., as shown in FIG. 2D). At this time, the ninth voltage value V9 may be less than the eighth voltage value V8 (e.g., as shown in FIG. 2C).

When the voltage of the reference node N_REF, which decreases over time, becomes equal to or substantially equal to the sixth voltage value V6 that is less than the reference voltage value V_REF at a time point t5 (e.g., see FIG. 2D), the comparator COMP may turn off the second switch SW_2 according to (e.g., based on) a comparison result of the comparison between the voltage of the reference node N_REF, which has the sixth voltage value V6, and the reference voltage value V_REF.

A time period td2, corresponding to a time it takes for the voltage of the reference node N_REF to become less than the reference voltage value V_REF from the seventh voltage value V7, may be longer than a time period td1, corresponding to a time it takes for the voltage of the reference node N_REF to become less than the reference voltage value V_REF from the fifth voltage value V5 (e.g., see FIG. 2D). This may be due to the increase in the upper limit of the voltage of the reference node N_REF caused by the input of the input signal.

The second switch SW_2, which is turned off, may turn off the first switch SW_1 by increasing the first operating voltage (e.g., the voltage of the input node N_V1), and the first switch SW_1, which is turned off, may turn on the main switch SW_M by decreasing the main operating voltage (e.g., the voltage of the input node N_VM).

As the main switch SW_M is turned on, the value of the output voltage (e.g., the voltage value of the node N_OUT) may again become equal to or substantially equal to the fourth voltage value V4.

As disclosed above, in an embodiment, the relay operation state maintaining device 100 may repeat the switching operation between decreasing the value of the output voltage (e.g., the voltage value of the node N_OUT) from the fourth voltage value V4 to the ninth voltage V9 value, and increasing the value of the output voltage from the ninth voltage value V9 to the fourth voltage value V4. Accordingly, the relay operation state maintaining device 100 may generate the output voltage having the average value corresponding to the second voltage value. In this case, the second voltage value may be less than the aforementioned first voltage value.

In other words, after the input signal is applied to the input node N_SIG, the relay operation state maintaining device 100 may generate the output voltage having the average value that is equal to or substantially equal to the second voltage value.

Figure 3:
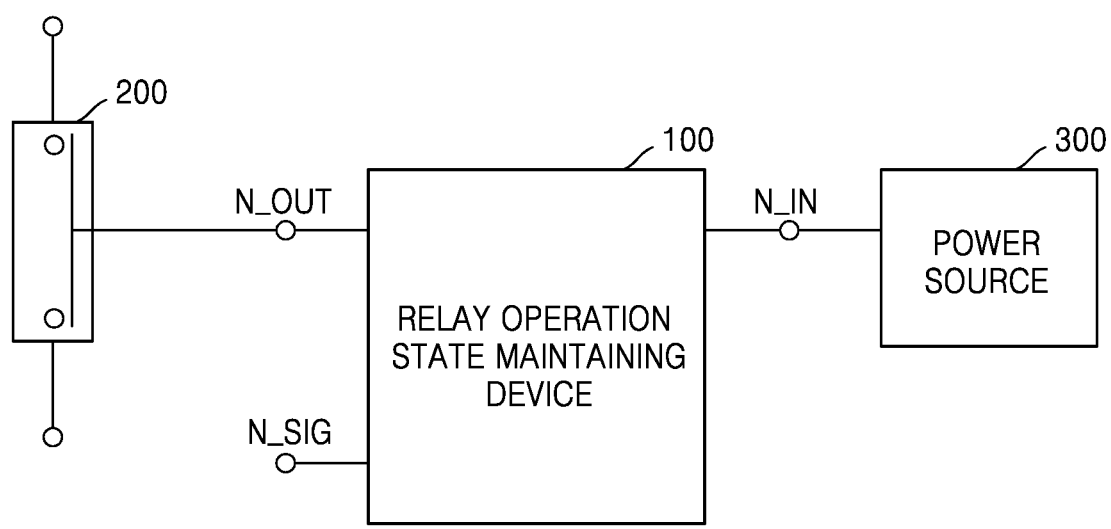
FIG. 3 is a block diagram schematically illustrating an example configuration of a relay system including the relay operation state maintaining device according to an embodiment.

FIG. 3 is a block diagram schematically illustrating an example configuration of a relay system including the relay operation state maintaining device 100 according to an embodiment.

Referring to FIG. 3, in an embodiment, the relay system may include the relay operation state maintaining device 100, a relay 200, and a power source 300.

In an embodiment, the relay operation state maintaining device 100 may maintain the operation state of the relay 200 with a second voltage value that is lower than a first voltage value corresponding to an initial driving voltage for the relay 200, which has been described above, and thus, redundant description thereof may not be repeated.

According to one or more example embodiments of the present disclosure, examples of the relay 200, which may be a control target object, may include various suitable kinds of switching devices configured to electrically connect and disconnect an electrical connection between two nodes. For example, the relay 200 may include (e.g., may be) any suitable kind of relay, for example, such as one of an electromagnetic relay, a solid state relay, and a contactless relay. In this case, the relay 200 may be of any one of a single pole single throw (SPST) type, a single pole double throw (SPDT) type, and a double pole double throw (DPDT) type.

However, the present disclosure is not limited to the above-listed examples of the relay 200. In other words, any suitable device capable of making and breaking (e.g., connecting and disconnecting) electrical connections between two nodes in response to a control signal may be used as the relay 200 without limitations.

In one or more embodiments, examples of the power source 300 may include various suitable power units (e.g., power supplies) configured to supply power to the relay 200. For example, the power source 300 may include (e.g., may be) a battery pack configured to supply DC power to the relay 200, or may be a power supply including a power converter configured to process and supply power supplied from a power grid by a suitable method to the relay 200. However, the present disclosure is not limited thereto.

As described above, according to one or more example embodiments of the present disclosure, after the transition of the relay 200 from an OFF state to an ON state, a voltage that is lower than a voltage used or required for the state transition of the relay 200 may be applied to the relay 200.

Because a relatively low voltage may used for maintaining the state of the relay 200, according to one or more example embodiments of the present disclosure, the lifespan of the relay 200 may increase, and/or accidents that may be caused by malfunctions of the relay 200 may be prevented or reduced.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A device for maintaining an operation state of a relay with a second voltage value that is less than a first voltage value, the first voltage value being an initial driving voltage for the relay, the device comprising:
   a main switch configured to output an output voltage to the relay by switching an input voltage according to a main operating voltage that varies according to an ON-OFF state of a first switch;
   the first switch configured to adjust the main operating voltage according to a first operating voltage that varies according to an ON-OFF state of a second switch;
   the second switch configured to control the first operating voltage according to an output voltage of a comparator;
   the comparator configured to output the output voltage by comparing a reference voltage value with a voltage of a reference node; and
   a third switch configured to control the voltage of the reference node according to an input signal.

2. The device of claim 1, wherein:
   the voltage of the reference node has a third voltage value, when the third switch is turned off before the input signal is input;
   the main switch is configured to be turned on as the input voltage having a fourth voltage value is applied; and
   the output voltage of the main switch becomes equal to the fourth voltage value according to the turned-on main switch.

3. The device of claim 2, wherein:
   the voltage of the reference node becomes equal to a fifth voltage value that is greater than the third voltage value in response to the output voltage of the main switch having the fourth voltage value;
   the comparator is configured to turn on the second switch according to a comparison result of a comparison between the voltage of the reference node having the fifth voltage value and the reference voltage value;
   the turned-on second switch is configured to turn on the first switch by decreasing the first operating voltage; and
   the turned-on first switch is configured to turn off the main switch by increasing the main operating voltage.

4. The device of claim 3, wherein the output voltage of the main switch decreases over time from the fourth voltage value by the turned-off main switch, and
   the voltage of the reference node decreases over time from the fifth voltage value in response to the output voltage of the main switch decreasing over time.

5. The device of claim 4, wherein, when the voltage of the reference node decreases over time to become equal to a sixth voltage value that is less than the reference voltage value:
   the comparator is configured to turn off the second switch according to a comparison result of a comparison between the reference voltage value and the voltage of the reference node having the sixth voltage value;
   the turned-off second switch is configured to turn off the first switch by increasing the first operating voltage; and
   the turned-off first switch is configured to turn on the main switch by decreasing the main operating voltage.

6. The device of claim 5, wherein the output voltage of the main switch becomes equal to the fourth voltage value by the turned-on main switch.

7. The device of claim 6, wherein the device is configured to generate the output voltage of the main switch to have an average value that corresponds to the first voltage value according to the switching of the main switch.

8. The device of claim 3, wherein:
   the output voltage of the main switch has the fourth voltage value, and the third switch is turned on, when the input voltage having the fourth voltage value is applied;
   the voltage of the reference node becomes equal to a seventh voltage value greater than the fifth voltage value;
   the comparator is configured to turn on the second switch according to a comparison result of a comparison between the reference voltage value and the voltage of the reference node having the seventh voltage value;
   the turned-on second switch is configured to turn on the first switch by decreasing the first operating voltage; and the turned-on first switch is configured to turn off the main switch by increasing the main operating voltage.

9. The device of claim 8, wherein:
the output voltage of the main switch decreases over time from the fourth voltage value by the turned-off main switch; and
the voltage of the reference node decreases over time from the seventh voltage value in response to the output voltage of the main switch decreasing over time.

10. The device of claim 9, wherein a time period that it takes for the voltage of the reference node to become less than the reference voltage value from the fifth voltage value is shorter than a time period that it takes for the voltage of the reference node to become less than the reference voltage value from the seventh voltage value.

11. The device of claim 9, wherein the device is configured to generate the output voltage of the main switch to have an average value that corresponds to the second voltage value according to the switching of the main switch.

* * * * *